United States Patent
Rodov et al.

(10) Patent No.: US 9,806,181 B2
(45) Date of Patent: Oct. 31, 2017

(54) INSULATED GATE POWER DEVICE USING A MOSFET FOR TURNING OFF

(71) Applicant: Pakal Technologies, LLC, San Francisco, CA (US)

(72) Inventors: Vladimir Rodov, Seattle, WA (US); Richard A. Blanchard, Los Altos, CA (US); Hidenori Akiyama, Miyagi (JP); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 4 days.

(21) Appl. No.: 14/994,103

(22) Filed: Jan. 12, 2016

(65) Prior Publication Data

US 2016/0204239 A1 Jul. 14, 2016

Related U.S. Application Data

(60) Provisional application No. 62/102,864, filed on Jan. 13, 2015.

(51) Int. Cl.
*H01L 29/739* (2006.01)
*H01L 29/747* (2006.01)
*H01L 29/745* (2006.01)
*H01L 29/749* (2006.01)
*H01L 29/66* (2006.01)
*H01L 29/74* (2006.01)

(52) U.S. Cl.
CPC .... *H01L 29/7455* (2013.01); *H01L 29/66371* (2013.01); *H01L 29/7404* (2013.01); *H01L 29/749* (2013.01)

(58) Field of Classification Search
None
See application file for complete search history.

(56) References Cited

U.S. PATENT DOCUMENTS

2006/0214221 A1* 9/2006 Challa ................. H01L 21/3065
257/328
2014/0091855 A1* 4/2014 Blanchard ............. H01L 29/402
327/440

FOREIGN PATENT DOCUMENTS

EP 0159663 A2 * 10/1985 ............. H01L 29/78

* cited by examiner

*Primary Examiner* — Johannes P Mondt
(74) *Attorney, Agent, or Firm* — Patent Law Group LLP; Brian D. Ogonowsky

(57) ABSTRACT

An insulated gate turn-off (IGTO) device has a PNPN layered structure so that vertical NPN and PNP transistors are formed. Trench gates are formed extending into the intermediate P-layer. The device is formed of an array of cells. A P-channel MOSFET, having a trenched gate, is formed in some of the cells. The control terminal of the IGTO device is connected to the insulated gates of all cells, including to the gate of the P-channel MOSFET, and to the intermediate P-layer. To turn the device on, a positive voltage is applied to the control terminal to turn on the NPN transistor by forward biasing its base-emitter. To turn off the IGTO device, a negative voltage is applied to the control terminal to turn on the P-channel MOSFET to short the NPN base to its emitter.

18 Claims, 4 Drawing Sheets

INSULATED GATE POWER DEVICE USING A MOSFET FOR TURNING OFF

CROSS-REFERENCE TO RELATED APPLICATIONS

This application is based on provisional application Ser. No. 62/102,864, filed Jan. 13, 2015, by Vladimir Rodov et al., assigned to the present assignee and incorporated herein by reference.

FIELD OF THE INVENTION

This invention relates to insulated gate turn-off (IGTO) devices and, more particularly, to IGTO devices that include improved turn-off and turn-on features.

BACKGROUND

U.S. Pat. No. 8,878,238, assigned to the present assignee and incorporated herein by reference, describes an IGTO device using trench gates and having PNPN layers which form vertical NPN and PNP bipolar transistors. When the gate is biased sufficiently high, the beta of the NPN transistor increases due to its base being narrowed by the gate field, causing the product of the betas of the NPN and PNP transistors to be greater than one. This condition initiates the turn-on of the IGTO device. To turn the device off, the gate is grounded, increasing the base width of the NPN transistor. No negative gate voltage is needed to turn off the device. This device works well but, with high currents, latch-up may occur, preventing the device to be turned off by grounding the gate. Further, the turn on and off voltages are susceptible to variations from lot to lot.

What is needed is an IGTO device with improved turn on and turn off characteristics.

SUMMARY

In one embodiment, a turn-off structure is included in a trench-gate IGTO device, where the turn off structure comprises a vertical P-channel MOSFET that is only turned on when its gate is sufficiently negative relative to the cathode (the top terminal). The IGTO device comprises a vertical PNPN structure plus the P-channel MOSFET. The PNPN structure forms a vertical NPN transistor and a vertical PNP transistor.

In one embodiment, the IGTO device is turned on by applying a positive bias to a diode coupled to the base of the NPN transistor to forward bias its base-emitter junction to turn it on and inject positive carriers (holes) into the base. The P-type base is also the source of the P-channel MOSFET. The diode allows current to flow into the NPN transistor base while the device is turned on but prevents current from flowing into the control terminal when the P-channel MOSFET gate is made negative for turning the P-channel MOSFET on, which turns off the IGTO device, since the diode is reversed biased in this condition.

Turning on of the P-channel MOSFET (with the negative gate voltage) effectively shorts the emitter and base of the NPN transistor together to force the NPN transistor to turn off, which immediately shuts off the IGTO device. At the same time, the positive voltage applied to the base of the NPN transistor is removed.

In another embodiment, an N-channel MOSFET is used to inject carriers (electrons) into the base of the PNP transistor in the IGTO device to initiate turn on of the IGTO device when a positive control voltage is applied to the IGTO device. This N-channel MOSFET may be formed along the sidewall of an insulated trench gate. The P-channel MOSFET, previously described, is turned on by a negative control voltage to force the NPN transistor off, which turns off the IGTO device.

The P-channel MOSFET and N-channel MOSFET do not need to be adjacent every trench gate, but can be distributed throughout the array of gates.

Each of the two embodiments may be realized as a 3 terminal device (anode, cathode, control terminal), or the device may be a 4-teminal device where the transistor base may be connected to an independent control voltage.

Other embodiments are described.

BRIEF DESCRIPTION OF THE DRAWINGS

Elements that are the same or equivalent are labelled with the same numerals.

DETAILED DESCRIPTION

The IGTO devices of the various embodiments may be packaged circuits formed on a single chip. The chip may have 3 or 4 terminals.

Figure 1:
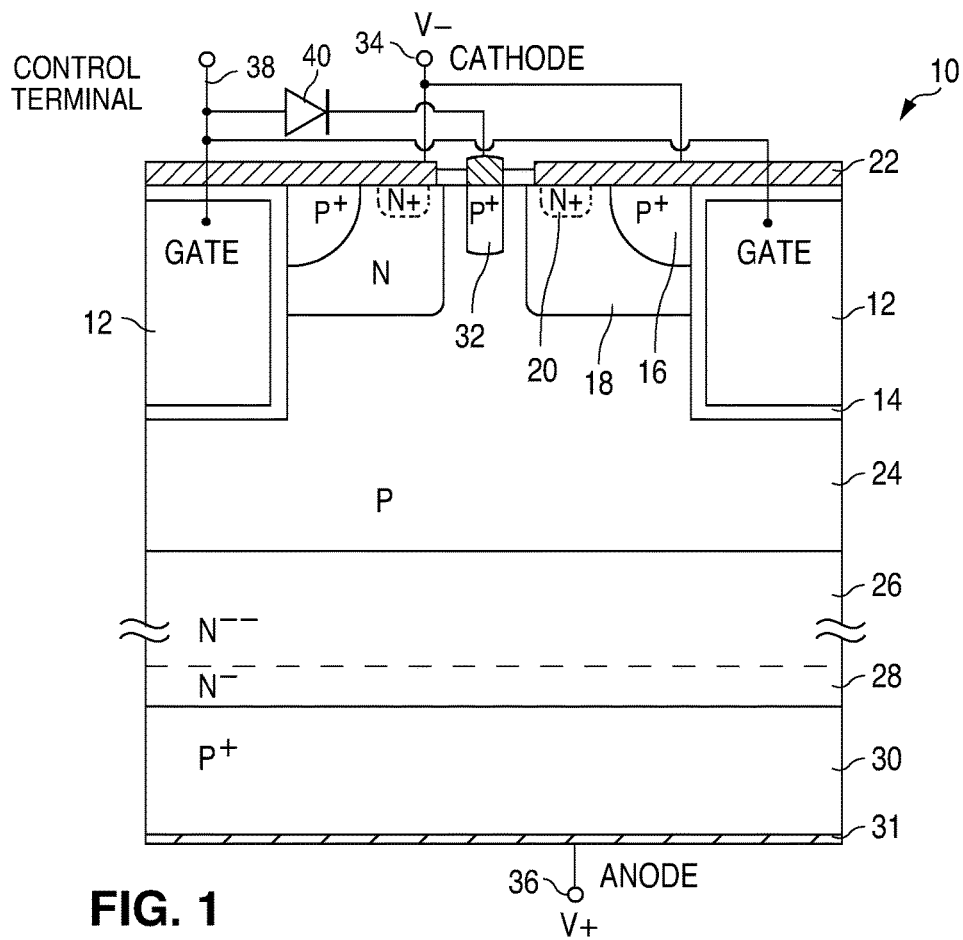
FIG. 1 is a cross-sectional view of a portion of an IGTO device, in accordance with one embodiment of the invention, where the portion illustrates a vertical P-channel MOSFET along the sidewall of the trench gate for turning the IGTO device off with a negative voltage applied to the control terminal, and also illustrates the control terminal coupled to the base of the NPN transistor via a diode for turning on the IGTO device with a positive control voltage.

FIG. 1 illustrates a small portion of an IGTO device 10. FIG. 1 shows a trenched gate 12, such as doped polysilicon, oxide 14 insulating the gate 12, a P+ region 16 (a drain region for a P-channel MOSFET), an N-region 18 (an emitter for a vertical NPN transistor), an N+ contact 20 for the N-region 18, a cathode metal 22 shorting the N-region 18 to the P+ region 16, a P-layer 24 (a base of the NPN transistor), an N−−layer 26 (a collector of the NPN transistor), an N-buffer layer 28 (part of the collector layer), a P+ layer 30 (the silicon growth substrate and an emitter for a vertical PNP transistor), an anode metal 31 contacting the P+ layer 30, a P+ contact region 32 for the P− layer 24, a cathode terminal 34, an anode terminal 36, a control terminal 38 connected to all the gates 12, and a diode 40 connected between the control terminal 38 and the P+ contact region 32. The diode 40 may be integrated in the IGTO device chip or may be an external component for a 4-terminal device. The diode 40 may instead be separate from the IGTO chip but packaged in the same package as the chip.

A resistor may also be included in series with the diode 40 to adjust the voltage applied to the P+ contact region 32.

The various regions' relative dopant levels are identified above by the + or − designation after the conductivity type. The P-layer 24 may be an epitaxial layer doped while growing, or a doped starting wafer with regions diffused in one or both surfaces, or may be an implanted well.

The particular configurations of the regions in FIG. 1 are used to rapidly turn off the IGTO device with a very repeatable negative gate threshold voltage irrespective of whether the device is in a high-current latch-up condition.

Figure 3:
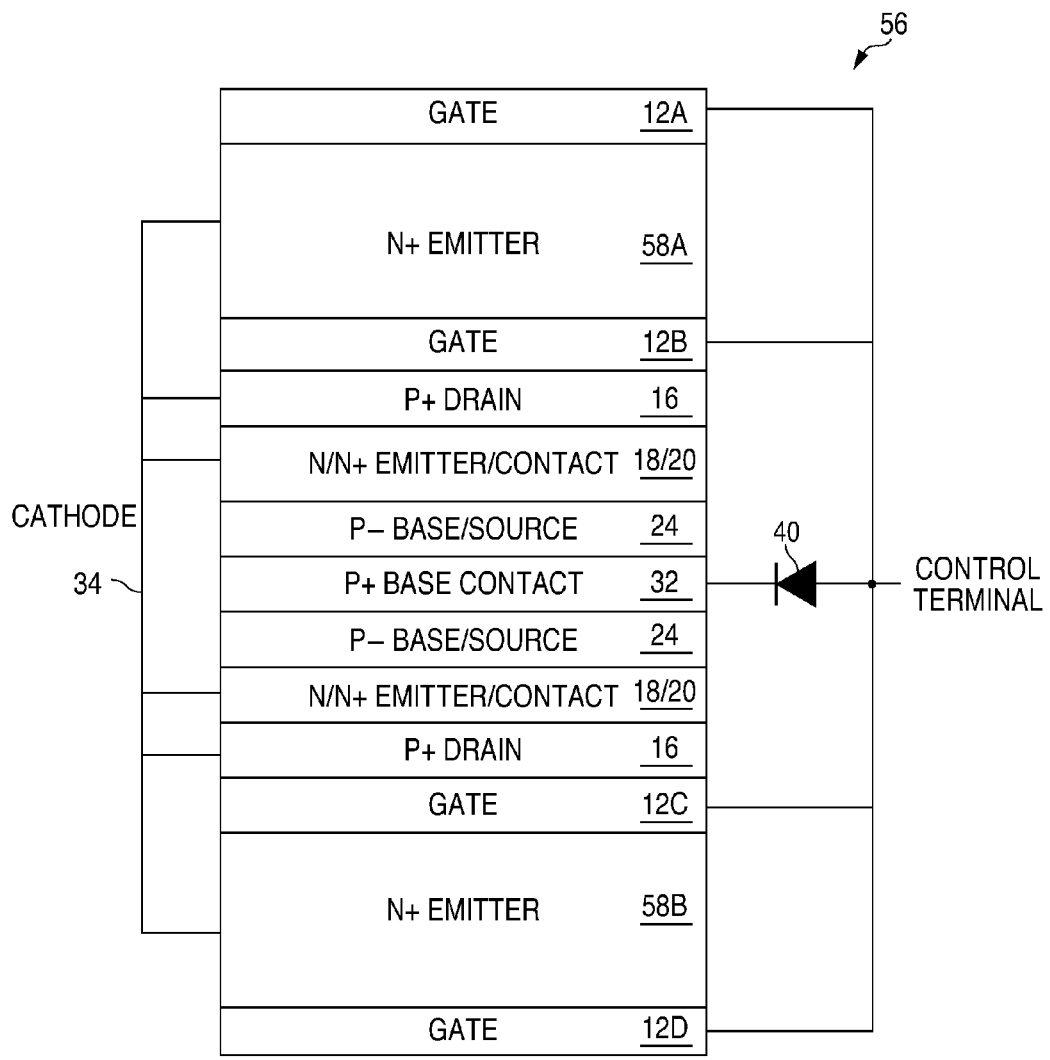
FIG. 3 is a simplified top down view of an IGTO device, showing only a section of the top-doped regions and the gates, that distributes the P-channel MOSFET of FIG. 1 around the IGTO device such that not all of the trench gates are part of a P-channel MOSFET.

The various regions and gates 12 shown in FIG. 1 may repeat to form an array of cells in the silicon chip, or the configuration of FIG. 1 may be distributed throughout a large array of cells where, for most of the cells, there is only an N-emitter layer between the trenched gates (as depicted in FIG. 3).

Figure 2:
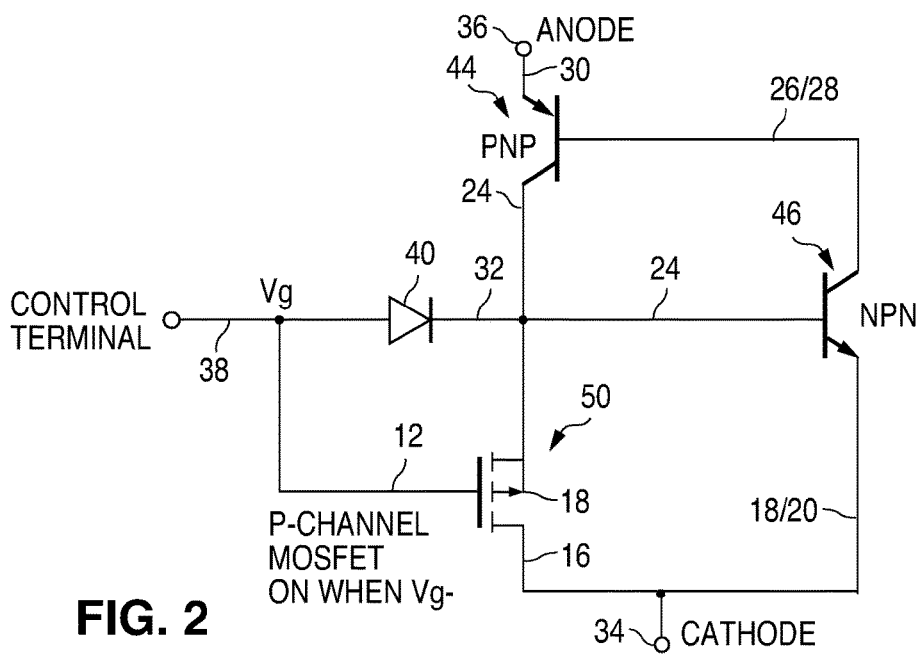
FIG. 2 is an equivalent circuit of the IGTO device of FIG. 1.

FIG. 2 shows an equivalent circuit with certain lines labeled with the element numbers in FIG. 1 to show the corresponding regions and gates.

It is assumed that a positive voltage is connected to the anode terminal 36 and a negative voltage (relative to the positive voltage) is connected to the cathode terminal 34. A load may have one terminal connected to the cathode terminal 34 and another terminal connected to ground so that turning on of the IGTO device 10 conducts current through the load.

When a sufficiently high positive voltage (relative to the cathode voltage) is applied to the control terminal 38, such as 2-5 volts, the IGTO device 10 is turned on as follows. (The threshold voltage is dependent on the dopant levels and configurations of the various layers and regions.) The operation of the IGTO device 10 will be explained with reference to the equivalent circuit of FIG. 2.

A bipolar PNP transistor 44 is formed by the P+ layer 30 (emitter), the N− layers 26/28 (base), and the P-layer 24 (collector). A bipolar NPN transistor 46 is formed by the N-region 20/18 (emitter), the P-layer 24 (base), and N-layers 26/28 (collector).

The positive voltage applied to the control terminal 38 positively biases the P-type layer 24, via the P+ contact region 32 and the diode 40, which forward biases the base-emitter of the NPN transistor 46 to turn on the NPN transistor. This injects positive carriers (holes) into the base of the NPN transistor and initiates the turn on of the IGTO device to start the flow of current between the cathode terminal 34 and the anode terminal 36. The IGTO device on-resistance is further reduced as the carriers are injected into the various layers to reduce the on-resistance of the lightly-doped layers 24, 26, and 28.

When the gate voltage is sufficiently negative (e.g. −5 volts) to turn on the P-channel MOSFET 50 (formed of the gate 12, the P+ region 16, the N-region 18, and the P-layer 24), the P-channel MOSFET 50 effectively shorts the emitter and base of the NPN transistor 46 to immediately turn it off, even if there was a high-current latch-up condition. The threshold voltage for the P-channel MOSFET 50 is easily repeatable from lot to lot, so the turn-off voltage for the IGTO device is very predictable.

The diode 40 is connected between the control terminal 38 and the P+ contact region 32 for the P-layer 24 (part of the base of the NPN transistor), where the P-layer 24 is also the source of the P-channel MOSFET 50. The diode 40 allows current to flow into the NPN base while the IGTO device is turned on with a positive control terminal 38 voltage but blocks any current when the control terminal 38 is made negative when turning off the IGTO device. The diode 40 also limits the level of the gate control voltage with respect to the NPN transistor base voltage. The diode 40 can be integrated on the same chip as the IGTO device 10 or can be external to the chip.

The dopant levels and the dimensions of the various regions and layers are dependent on the current and breakdown voltage requirements of the IGTO device. Suitable dimensions for a particular application can be determined by simulation by one skilled in the art without undue experimentation.

The P+ region 16 reduces the NPN transistor emitter area, so the P-channel MOSFET 50 structures need not be in every cell. The IGTO device may have strips of the P+ regions 16 parallel to strips of the trenched gates to form an array cells, and the cells are connected in parallel by the cathode and anode metal layers. All the cells may be formed in the common P-layer 24. All trench gates are electrically connected together, such as with a polysilicon bus, and are controlled by the control terminal 38. Every nth cell (e.g., every tenth cell) may include the P-channel MOSFET 50 to turn off the IGTO device. Turning on the distributed P-channel MOSFET 50 will sufficiently short the emitters and bases of all the NPN transistors formed in the cell array, assuming they all share the common P-layer 24.

FIG. 3 is a top down view of a small repeating portion of an IGTO device 56, which incorporates the structure of FIG. 1, showing an array of trench gates 12A-12D and the top doped areas of the device 56. The cells are arranged in horizontal stripes, but other shapes of the cells can be used, such as hexagons, squares, etc. The regions are labeled with the same numerals used in FIG. 1. Note that the center area (a single cell) between gates 12B and 12C is the same structure shown in FIG. 1. The cells above and below the center area do not include the P-channel MOSFET 50 (FIG. 2) but include a continuous N+ region 58A and 58B, acting as an emitter for the NPN transistor. Such cells have a higher current density than the ones with the P-channel MOSFET since they have a larger emitter.

The conductivity types in FIGS. 1-3 may be reversed and the control voltages would be the opposite polarity.

In one embodiment, the IGTO device is a 3-terminal device where the control terminal is connected to all the gates. In another embodiment, the IGTO device is a 4-terminal device with one control terminal coupled to all the gates and another terminal coupled to the diode 40 and the P+ contact region 32. This configuration allows some added control of the timing of the turn off, such as applying the turn off signals to the two control terminals at different times, making the turn off more gradual to reduce EMI. Making the control terminals independent also allows the control voltages to be different to allow optimal control voltages to be applied to the gates and to the P+ region 32. The control voltages may be ramped or stepped to control the turn-on/off characteristics.

Figure 4:
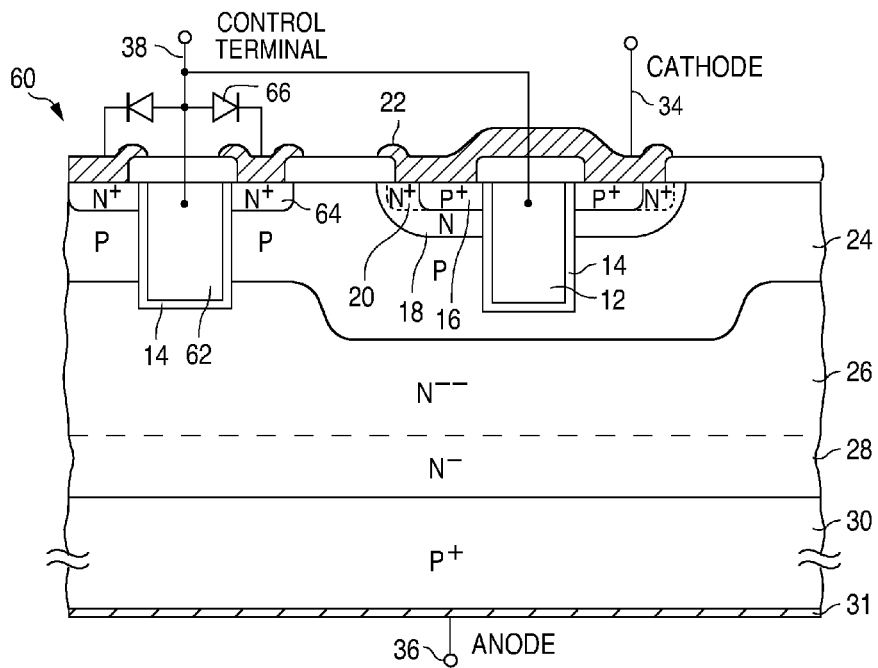
FIG. 4 is a cross-sectional view of another embodiment that uses the P-channel MOSFET of FIG. 1 to turn off the IGTO device (with a negative gate voltage) and uses a vertical N-channel MOSFET to turn on the IGTO device (with a positive gate voltage).

FIG. 4 illustrates an alternative "turn-on" feature for an IGTO device. The cell structure on the right side of FIG. 4 may be the same as the cell structure of FIG. 1, and the regions/layers are labeled with the same numerals. The vertical N-channel MOSFET 60 on the left side of FIG. 4 extends through the P-layer 24 and into the N--layer 26. This structure can be obtained by making the P-layer 24 shallower or making the trench gate deeper. When the gate 62 is at a positive voltage for turning on the IGTO device, the channel between the N+ region 64 and the N--layer 26 is inverted so that current flows between the control terminal 38 and the N−−-layer 26 through the diode 66. This structure injects electrons into the base (N− layers 26/28) of the PNP transistor and, in turn, injects holes into the base of the NPN transistor, which initiates a full turn on of the IGTO device. The N-channel MOSFET 60 causes the turn on to occur at a repeatable and precise level. The device is shut off by turning on the P-channel MOSFET 50 (FIG. 5) with a negative gate 12 voltage. The N-channel MOSFET 60 may be distributed around the array of cells, such as every tenth cell.

Figure 5:
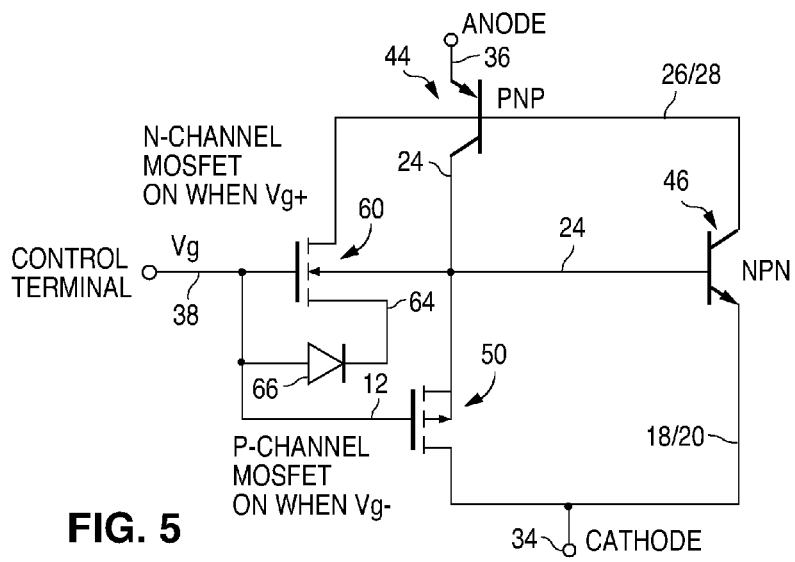
FIG. 5 is an equivalent circuit of the IGTO device of FIG. 4.

FIG. 5 is an equivalent circuit of FIG. 4 showing the N-channel MOSFET 60, where turning on the N-channel MOSFET 60 with a sufficiently positive gate voltage electrically connects the N+ region 64 to the N−−-layer 26 to start the flow of current between the cathode terminal 34 and anode terminal 36.

The diode 66 is connected between the control terminal 38 and the N+ region 64 to allow current to flow into the N−−-layer 26 when the IGTO device is turned on but blocks any current when the control terminal 38 is made negative when turning off the IGTO device. The diode 66 can be integrated on the same chip as the IGTO device or can be external to the chip.

Figure 6:
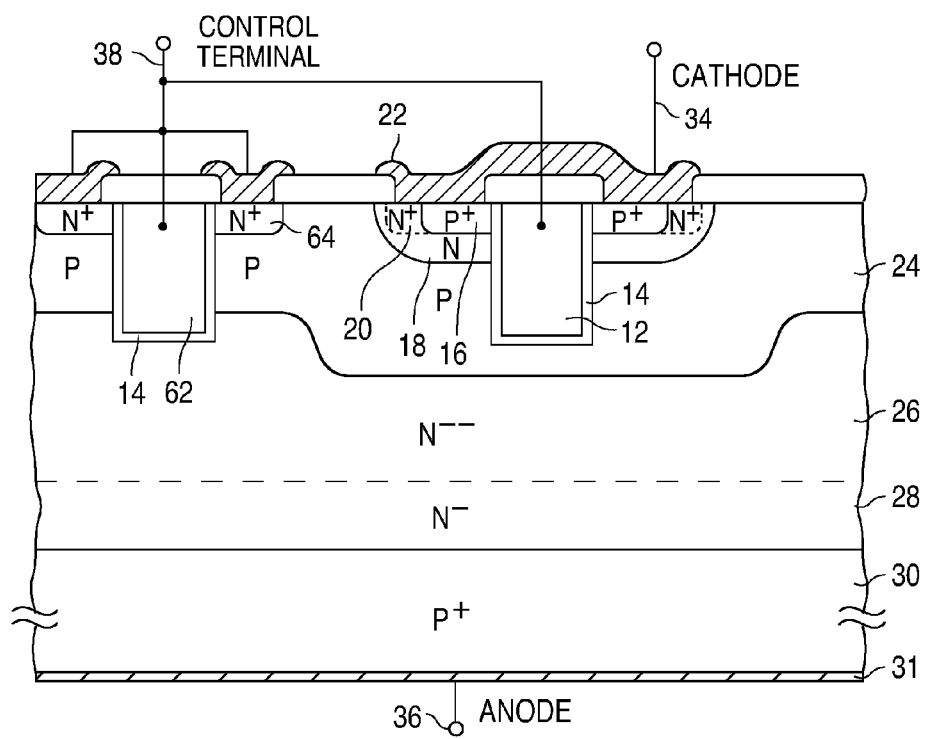
FIG. 6 illustrates the embodiment of FIG. 4 but without a diode connected to the control terminal.

The diode 66 may be optional if the negative voltage on the control terminal 38 will not draw significant current through the N+ region 64 in the IGTO device's off state. FIG. 6 is identical to FIG. 4 but without the diode 66.

Since the turn on of the IGTO device is initiated by the injection of carriers into the N-layer 26 by the turning on of the N-channel MOSFET 60, there is no reason to couple the control terminal 38 to the P-layer 24 (the base of the NPN transistor) to forward bias the base-emitter of the NPN transistor 46, as shown in FIG. 1.

Although FIGS. 4-6 illustrate a 3-terminal device, the control terminal for the two gates 12/64 can be separate, to form a 4-terminal device, to provide more optimal control over the turn on and turn off of the device. A resistor may be added in series with the diode 40 (FIG. 1) to create a desired voltage drop between the control terminal voltage and the P+ contact region 32 when turning on the IGTO device.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gates within trenches formed at least within the third semiconductor layer;
   at least some of the cells being first cells comprising:
   a first insulated gate formed within a trench terminating within the third semiconductor layer;
   a first semiconductor region of the second conductivity type over the third semiconductor layer and adjacent to the first insulated gate;
   a second semiconductor region of the first conductivity type over the first semiconductor region and adjacent to the first insulated gate region;
   wherein the second semiconductor region, the first semiconductor region, the third semiconductor layer, and the first insulated gate form a first MOSFET;
   wherein the first semiconductor layer, the second semiconductor layer, and the third semiconductor layer form a first emitter, first base, and first collector, respectively, of a vertical first bipolar transistor of a first type;
   wherein the first semiconductor region, the third semiconductor layer, and the second semiconductor layer form a second emitter, second base, and second collector, respectively, of a vertical second bipolar transistor of a second type;
   a first electrode electrically coupled to the first semiconductor layer;
   a second electrode electrically coupled to the first semiconductor region and the second semiconductor region and shorting the first semiconductor region to the second semiconductor region; and
   wherein a first voltage of a first polarity, relative to a second voltage on the second electrode, applied to the first insulated gate turns on the first MOSFET, which turns off the second bipolar transistor by forming a conductive channel between the second emitter and the second base of the second bipolar transistor, and wherein turning off the second bipolar transistor turns off the IGTO device; and
   a control terminal electrically coupled to the first insulated gate, wherein the control terminal is also electrically coupled to the third semiconductor layer, such that a third voltage, having a polarity opposite to that of the first voltage, applied to the control terminal forward biases the second base and second emitter of the second bipolar transistor to turn it on, which turns on the IGTO device.

2. The device of claim 1 wherein the first conductivity type is a p-type, and the second conductivity type is an n-type.

3. The device of claim 1 wherein the first conductivity type is an n-type, and the second conductivity type is a p-type.

4. The device of claim 1 wherein the first semiconductor layer is a starting substrate.

5. The device of claim 1 wherein the third semiconductor layer is formed as a well with implanted dopants.

6. The device of claim 1 wherein the first electrode is an anode electrode and the second electrode is a cathode electrode.

7. The device of claim 1 further comprising a diode between the control terminal and the third semiconductor layer.

8. The device of claim 1 wherein the first cells are distributed among the array of cells.

9. An insulated gate turn-off (IGTO) device comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gates within trenches formed at least within the third semiconductor layer;

at least some of the cells being first cells comprising:
a first insulated gate formed within a trench terminating within the third semiconductor layer;
a first semiconductor region of the second conductivity type over the third semiconductor layer and adjacent to the first insulated gate;
a second semiconductor region of the first conductivity type over the first semiconductor region and adjacent to the first insulated gate region;
wherein the second semiconductor region, the first semiconductor region, the third semiconductor layer, and the first insulated gate form a first MOSFET;
wherein the first semiconductor layer, the second semiconductor layer, and the third semiconductor layer form a first emitter, first base, and first collector, respectively, of a vertical first bipolar transistor of a first type;
wherein the first semiconductor region, the third semiconductor layer, and the second semiconductor layer form a second emitter, second base, and second collector, respectively, of a vertical second bipolar transistor of a second type;
a first electrode electrically coupled to the first semiconductor layer;
a second electrode electrically coupled to the first semiconductor region and the second semiconductor region and shorting the first semiconductor region to the second semiconductor region;
wherein a first voltage of a first polarity, relative to a second voltage on the second electrode, applied to the first insulated gate turns on the first MOSFET, which turns off the second bipolar transistor by forming a conductive channel between the second emitter and the second base of the second bipolar transistor, and wherein turning off the second bipolar transistor turns off the IGTO device,
wherein the first cells are distributed among the array of cells, and wherein the first cells form fewer than half of all the cells in the array of cells.

10. An insulated gate turn-off (IGTO) device comprising:
a first semiconductor layer of a first conductivity type;
a second semiconductor layer of a second conductivity type overlying the first semiconductor layer;
a third semiconductor layer of the first conductivity type overlying at least a portion of the second semiconductor layer;
an array of cells comprising a plurality of insulated gates within trenches formed at least within the third semiconductor layer;
at least some of the cells being first cells comprising:
a first insulated gate formed within a trench terminating within the third semiconductor layer;
a first semiconductor region of the second conductivity type over the third semiconductor layer and adjacent to the first insulated gate;
a second semiconductor region of the first conductivity type over the first semiconductor region and adjacent to the first insulated gate region;
wherein the second semiconductor region, the first semiconductor region, the third semiconductor layer, and the first insulated gate form a first MOSFET;
wherein the first semiconductor layer, the second semiconductor layer, and the third semiconductor layer form a first emitter, first base, and first collector, respectively, of a vertical first bipolar transistor of a first type;
wherein the first semiconductor region, the third semiconductor layer, and the second semiconductor layer form a second emitter, second base, and second collector, respectively, of a vertical second bipolar transistor of a second type;
a first electrode electrically coupled to the first semiconductor layer;
a second electrode electrically coupled to the first semiconductor region and the second semiconductor region and shorting the first semiconductor region to the second semiconductor region; and
wherein a first voltage of a first polarity, relative to a second voltage on the second electrode, applied to the first insulated gate turns on the first MOSFET, which turns off the second bipolar transistor by forming a conductive channel between the second emitter and the second base of the second bipolar transistor, and wherein turning off the second bipolar transistor turns off the IGTO device;
a second insulated gate that extends through the third semiconductor layer and into the second semiconductor layer, the second insulated gate being electrically coupled to the first insulated gate;
a third semiconductor region of the second conductivity type adjacent the second insulated gate,
wherein the third semiconductor region, the third semiconductor layer, and the second semiconductor layer form a second MOSFET; and
wherein a third voltage, having a polarity opposite to that of the first voltage, applied to the second insulated gate turns on the second MOSFET to conduct a current between the third semiconductor region and the second semiconductor layer to inject carriers into the second semiconductor layer to initiate turn on of the IGTO device.

11. The device of claim 10 wherein the second MOSFET is an N-channel MOSFET.

12. A method performed by an insulated gate turn-off (IGTO) device, the device comprising:
a first semiconductor layer of a first conductivity type;
a second semiconductor layer of a second conductivity type overlying the first semiconductor layer;
a third semiconductor layer of the first conductivity type overlying at least a portion of the second semiconductor layer;
an array of cells comprising a plurality of insulated gates within trenches formed at least within the third semiconductor layer;
at least some of the cells being first cells comprising:
a first insulated gate formed within a trench terminating within the third semiconductor layer;
a first semiconductor region of the second conductivity type over the third semiconductor layer and adjacent to the first insulated gate;
a second semiconductor region of the first conductivity type over the first semiconductor region and adjacent to the first insulated gate region;
wherein the second semiconductor region, the first semiconductor region, the third semiconductor layer, and the first insulated gate forms a first MOSFET;
wherein the first semiconductor layer, the second semiconductor layer, and the third semiconductor layer form a first emitter, first base, and first collector, respectively, of a vertical first bipolar transistor of a first type;
wherein the first semiconductor region, the third semiconductor layer, and the second semiconductor layer form a second emitter, second base, and second collector, respectively, of a vertical second bipolar transistor of a second type;
a first electrode electrically coupled to the first semiconductor layer;
a second electrode electrically coupled to the first semiconductor region and the second semiconductor region and shorting the first semiconductor region to the second semiconductor region;
the method comprising:
applying a first voltage of a first polarity, relative to a second voltage on the second electrode, to the first insulated gate to turn on the first MOSFET, which turns off the second bipolar transistor by forming a conductive channel between the second emitter and the second base of the second bipolar transistor, and wherein turning off the second bipolar transistor turns off the IGTO device;
wherein the device further comprises a control terminal electrically coupled to the first insulated gate, wherein the control terminal is also electrically coupled to the third semiconductor layer,
wherein the method further comprises applying a third voltage, having a polarity opposite to that of the first voltage, to the control terminal to forward bias the second base and second emitter of the second bipolar transistor to turn it on, which turns on the IGTO device.

13. A method performed by an insulated gate turn-off (IGTO) device, the device comprising:
a first semiconductor layer of a first conductivity type;
a second semiconductor layer of a second conductivity type overlying the first semiconductor layer;
a third semiconductor layer of the first conductivity type overlying at least a portion of the second semiconductor layer;
an array of cells comprising a plurality of insulated gates within trenches formed at least within the third semiconductor layer;
at least some of the cells being first cells comprising:
a first insulated gate formed within a trench terminating within the third semiconductor layer;
a first semiconductor region of the second conductivity type over the third semiconductor layer and adjacent to the first insulated gate;
a second semiconductor region of the first conductivity type over the first semiconductor region and adjacent to the first insulated gate region;
wherein the second semiconductor region, the first semiconductor region, the third semiconductor layer, and the first insulated gate forms a first MOSFET;
wherein the first semiconductor layer, the second semiconductor layer, and the third semiconductor layer form a first emitter, first base, and first collector, respectively, of a vertical first bipolar transistor of a first type;
wherein the first semiconductor region, the third semiconductor layer, and the second semiconductor layer form a second emitter, second base, and second collector, respectively, of a vertical second bipolar transistor of a second type;
a first electrode electrically coupled to the first semiconductor layer;
a second electrode electrically coupled to the first semiconductor region and the second semiconductor region and shorting the first semiconductor region to the second semiconductor region;
the method comprising:
applying a first voltage of a first polarity, relative to a second voltage on the second electrode, to the first insulated gate to turn on the first MOSFET, which turns off the second bipolar transistor by forming a conductive channel between the second emitter and the second base of the second bipolar transistor, and wherein turning off the second bipolar transistor turns off the IGTO device;
wherein the device further comprises:
a second insulated gate that extends through the third semiconductor layer and into the second semiconductor layer, the second insulated gate being electrically coupled to the first insulated gate;
a third semiconductor region of the second conductivity type adjacent the second insulated gate,
wherein the third semiconductor region, the third semiconductor layer, and the second semiconductor layer form a second MOSFET, and
wherein the method further comprises applying a third voltage, having a polarity opposite to that of the first voltage, to the second insulated gate to turn on the second MOSFET to conduct a current between the third semiconductor region and the second semiconductor layer to inject carriers into the second semiconductor layer to initiate turn on of the IGTO device.

14. The method of claim 13 wherein the first MOSFET is a P-channel MOSFET and the second MOSFET is an N-channel MOSFET.

15. The method of claim 12 wherein the first conductivity type is a p-type, and the second conductivity type is an n-type.

16. The method of claim 12 wherein the first conductivity type is an n-type, and the second conductivity type is a p-type.

17. The method of claim 12 wherein the first semiconductor layer is a starting substrate.

18. The method of claim 12 wherein the third semiconductor layer is formed as a well with implanted dopants.

* * * * *